United States Patent
Park et al.

(10) Patent No.: US 12,310,004 B2
(45) Date of Patent: May 20, 2025

(54) SEMICONDUCTOR DEVICE INCLUDING ELEMENT ISOLATION FILM AND METHOD FOR FABRICATING THE SAME

(71) Applicant: Samsung Electronics Co., Ltd., Suwon-si (KR)

(72) Inventors: Tae Jin Park, Yongin-si (KR); Gyul Go, Seoul (KR); Jun Soo Kim, Seongnam-si (KR); Gyung Hyun Yoon, Hwaseong-si (KR); Eui Jun Cha, Seoul (KR); Hui-Jung Kim, Seongnam-si (KR); Yoo Sang Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 17/735,292

(22) Filed: May 3, 2022

(65) Prior Publication Data
US 2023/0043936 A1    Feb. 9, 2023

(30) Foreign Application Priority Data

Aug. 3, 2021  (KR) .......................... 10-2021-0101998

(51) Int. Cl.
*H01L 21/762*    (2006.01)
*H10B 12/00*    (2023.01)
(Continued)

(52) U.S. Cl.
CPC ........... *H10B 12/34* (2023.02); *H01L 21/762* (2013.01); *H01L 21/7624* (2013.01);
(Continued)

(58) Field of Classification Search
CPC . H10B 12/34; H10B 12/053; H01L 29/42356; H01L 29/4236; H01L 29/42336;
(Continued)

(56) References Cited

U.S. PATENT DOCUMENTS 5,068,203 A * 11/1991 Logsdon ............... G01L 9/0042
                                                                216/2
6,759,282 B2    7/2004 Campbell et al.
(Continued)

FOREIGN PATENT DOCUMENTS

KR    20140091840 A    7/2014
KR      102000169 B1    7/2019
KR    20220168854 A  * 12/2022    ............. H10B 12/34

OTHER PUBLICATIONS

Rai-Choudhury, P., & Hower, L. (1973). Growth and characterization of polycrystalline silicon. Journal of the Electrochemical Society, 120(12), 1761-6. doi:http://dx.doi.org/10.1149/1.2403359 (Year: 1973).*

(Continued)

*Primary Examiner* — Nicholas J Tobergte
*Assistant Examiner* — William H Anderson
(74) *Attorney, Agent, or Firm* — Harness, Dickey & Pierce, P.L.C.

(57) ABSTRACT

A semiconductor device and a method for fabricating the same is provided. The semiconductor device includes a lower semiconductor film, a buried insulating film, and an upper semiconductor film which are sequentially stacked; an element isolation film defining an active region inside the substrate and including a material having an etching selectivity with respect to silicon oxide; a first gate trench inside the upper semiconductor film; a first gate electrode filing a part of the first gate trench; a second gate trench inside the element isolation film; and a second gate electrode filling a part of the second gate trench, a bottom side of the element isolation film being inside the lower semiconductor film.

18 Claims, 16 Drawing Sheets

(51) Int. Cl.
   *H01L 29/10*   (2006.01)
   *H01L 29/423*  (2006.01)

(52) U.S. Cl.
   CPC .. *H01L 21/76264* (2013.01); *H01L 21/76283* (2013.01); *H10B 12/05* (2023.02); *H10B 12/053* (2023.02); *H10B 12/315* (2023.02); *H10B 12/488* (2023.02); *H01L 29/1037* (2013.01); *H01L 29/4236* (2013.01)

(58) Field of Classification Search
   CPC ............. H01L 27/1203; H01L 27/1207; H01L 21/762; H01L 21/7624; H01L 21/76264; H01L 21/76283; H01L 21/76224; H01L 29/1037
   See application file for complete search history.

(56) References Cited

U.S. PATENT DOCUMENTS

| | | |
|---|---|---|
| 7,808,028 B2 | 10/2010 | Cheng |
| 9,368,590 B2 | 6/2016 | Fan et al. |
| 9,455,329 B2* | 9/2016 | Min .................. H01L 29/36 |
| 9,633,854 B2 | 4/2017 | Zhu et al. |
| 10,319,732 B2 | 6/2019 | Richter et al. |
| 2013/0164907 A1* | 6/2013 | Lee .................... H01L 21/76 438/488 |
| 2019/0296017 A1* | 9/2019 | Cho ................ H01L 27/1203 |
| 2021/0091085 A1* | 3/2021 | Yoon ................ H01L 29/7851 |
| 2022/0102193 A1* | 3/2022 | Kim ................ H01L 21/76224 |
| 2024/0179891 A1* | 5/2024 | Wei .................. H10B 12/315 |

OTHER PUBLICATIONS

Translation of Go, KR-20220168854-A (Year: 2022).*

* cited by examiner

SEMICONDUCTOR DEVICE INCLUDING ELEMENT ISOLATION FILM AND METHOD FOR FABRICATING THE SAME

CROSS-REFERENCE TO RELATED APPLICATION

This application claims priority to Korean Patent Application No. 10-2021-0101998, filed on Aug. 3, 2021, and all the benefits accruing therefrom under 35 U.S.C. § 119, the disclosure of which is incorporated herein by reference in its entirety.

BACKGROUND

1. Field

The present disclosure relates to semiconductor devices and methods for fabricating the same.

2. Description of the Related Art

A buried channel array transistor (BCAT) may include a gate electrode buried inside a trench to minimize a short channel effect.

On the other hand, as semiconductor memory devices gradually become highly integrated, individual circuit patterns are further miniaturized to realize more semiconductor devices in the same area. Such a miniaturization of circuit patterns causes many problems in the fabricating process of the semiconductor devices.

In particular, as the semiconductor devices become highly integrated, the influence of leakage currents gradually increases. Such leakage currents occur in various portions of the semiconductor devices. In particular, because the refresh characteristics of a DRAM (Dynamic Random Access Memory) are greatly affected by the leakage current, a semiconductor device capable of minimizing the leakage current is desired.

SUMMARY

Aspects of the present disclosure provide semiconductor devices having improved product reliability.

Aspects of the present disclosure also provide methods for fabricating a semiconductor device having improved product reliability.

According to an aspect of the present disclosure, there is provided a semiconductor device comprising a substrate including a lower semiconductor film, a buried insulating film, and an upper semiconductor film which are sequentially stacked; an element isolation film defining an active region inside the substrate and including a material having an etching selectivity with respect to silicon oxide; a first gate trench inside the upper semiconductor film; a first gate electrode filling a part of the first gate trench; a second gate trench inside the element isolation film; and a second gate electrode filling a part of the second gate trench, a bottom side of the element isolation film being inside the lower semiconductor film.

According to another aspect of the present disclosure, there is provided a semiconductor device comprising a substrate including a lower semiconductor film, a buried insulating film, and an upper semiconductor film which are sequentially stacked; an element isolation film defining an active region inside the substrate, and having a bottom side inside the lower semiconductor film; a conductive pattern extending along the element isolation film between the element isolation film and the substrate; a first gate trench penetrating the upper semiconductor film and having a bottom side inside the upper semiconductor film; a first gate electrode filling a part of the first gate trench; a second gate trench inside the element isolation film; and a second gate electrode filling a part of the second gate trench.

According to still another aspect of the present disclosure, there is provided a method for fabricating a semiconductor device, the method comprising forming an element isolation trench which defines a plurality of active regions, using a mask pattern, on a substrate in which a lower semiconductor film, a buried insulating film, and an upper semiconductor film are sequentially stacked; forming an element isolation film which fills the element isolation trench; and forming a gate structure extending in a first direction inside the element isolation film and a respective one of the plurality of active regions, a bottom side of the element isolation trench is inside the lower semiconductor film, and the buried insulating film includes a material having an etching selectivity with respect to the mask pattern.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
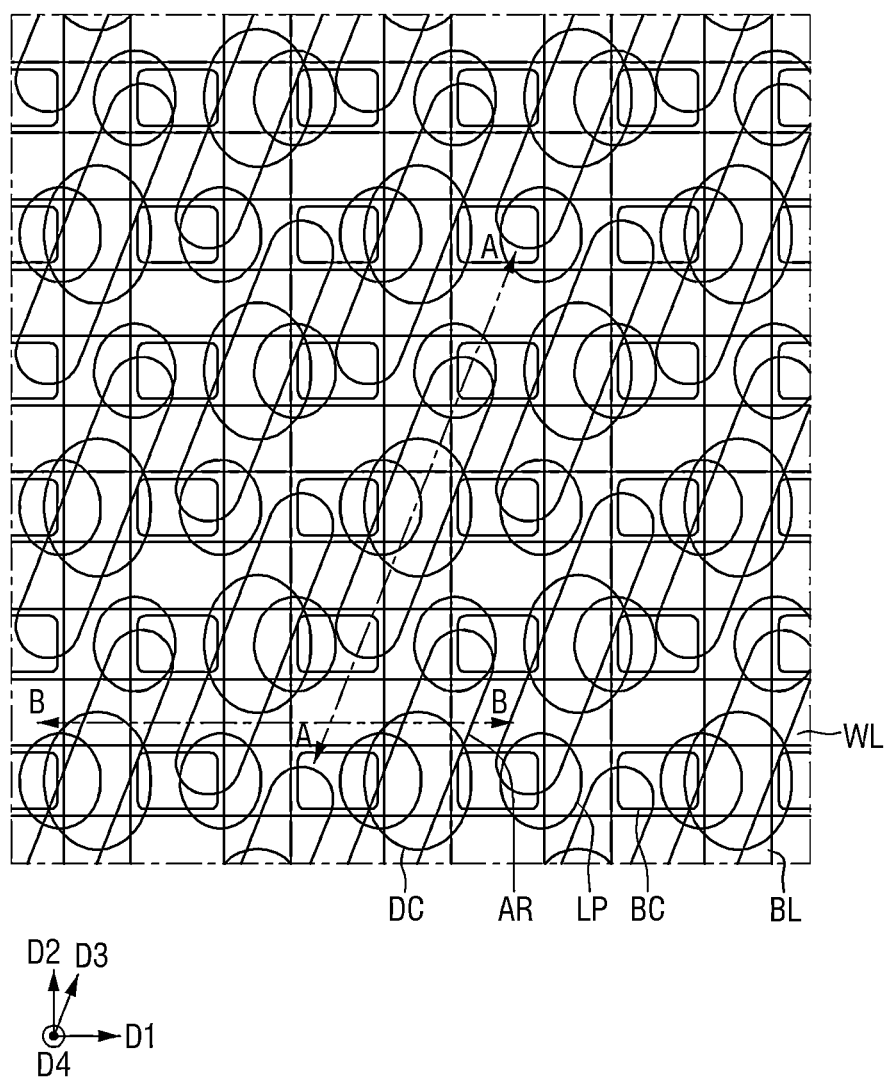
FIG. 1 is a schematic layout diagram for explaining a semiconductor device according to some example embodiments.
Figure 2:
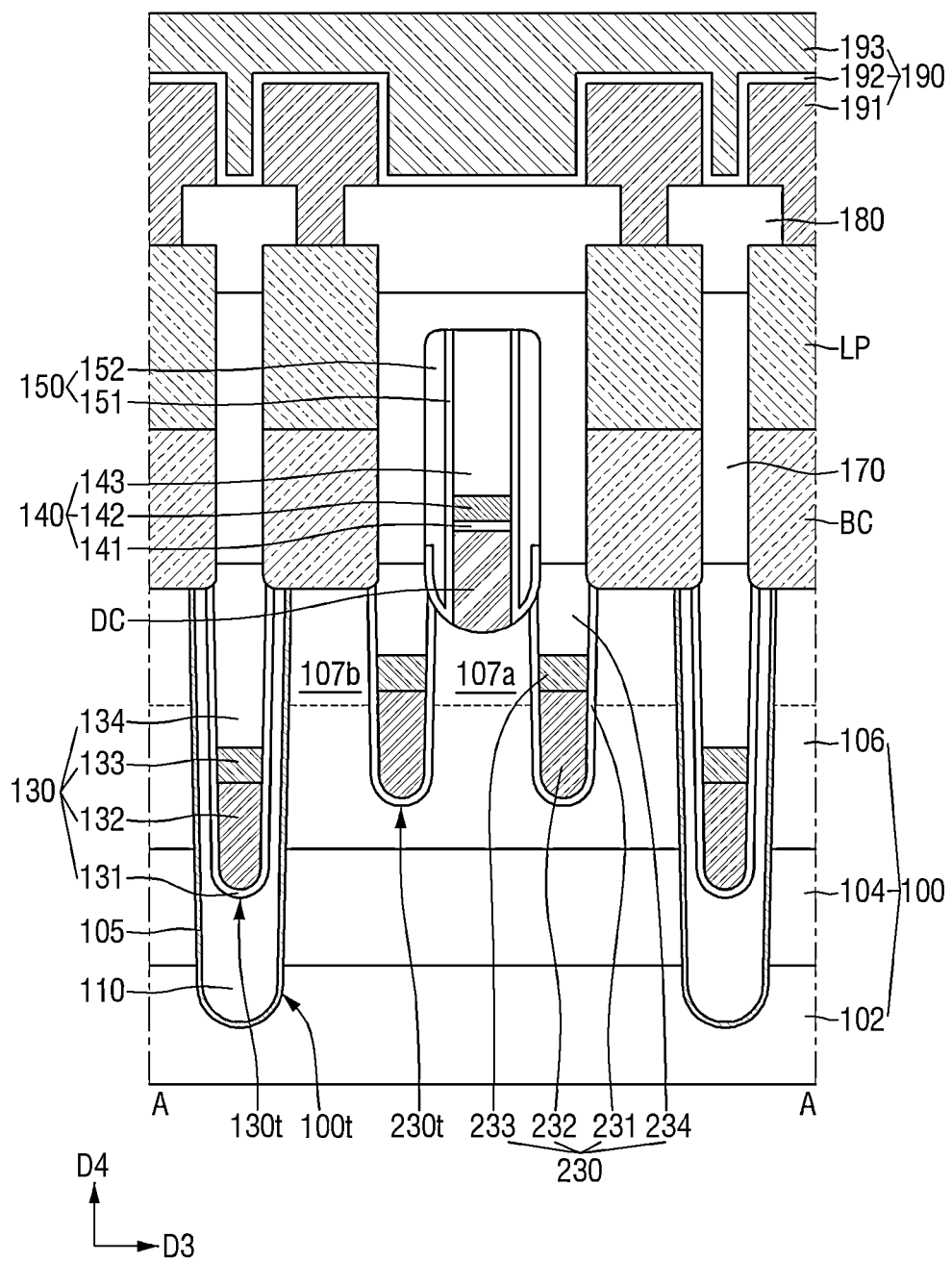
FIG. 2 is a cross-sectional view taken along a line A-A of FIG. 1.
Figure 3:
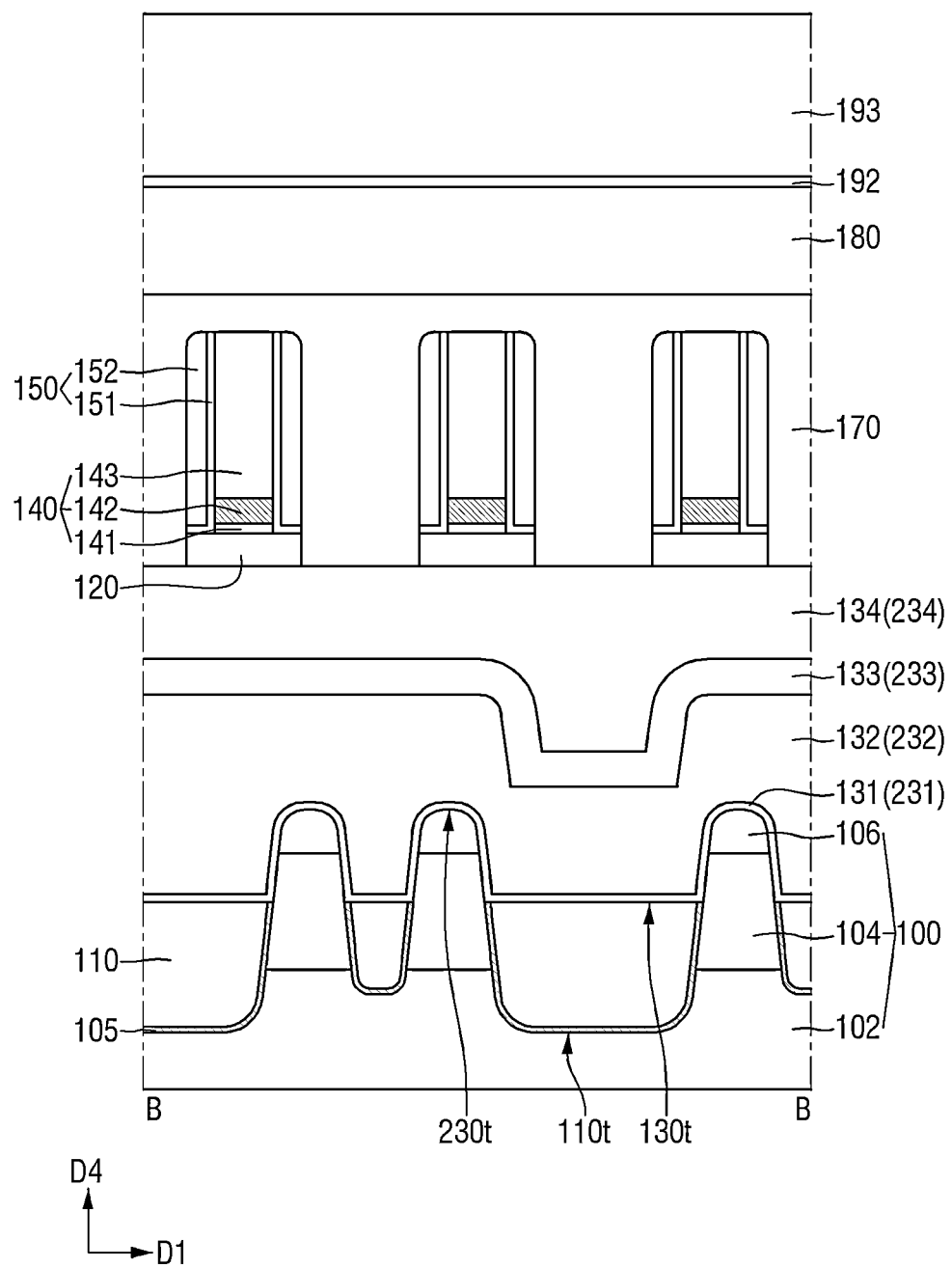
FIG. 3 is a cross-sectional view taken along a line B-B of FIG. 1.

FIG. 1 is a schematic layout diagram for explaining a semiconductor device according to some example embodiments. FIG. 2 is a cross-sectional view taken along the line A-A of FIG. 1. FIG. 3 is a cross-sectional view taken along the line B-B of FIG. 1.

Referring to FIG. 1, a semiconductor device according to some example embodiments may include a plurality of bit lines BL, a plurality of word lines WL, a direct contact DC, a buried contact BC, and a landing pad LP.

Each of the plurality of word lines WL may extend in a first direction D1. Each of the plurality of word lines WL may be spaced apart from each other in a second direction D2. Each of the plurality of word lines WL may be disposed at equal intervals from each other. The second direction D2 may intersect the first direction D1. The second direction D2 may be perpendicular to, for example, the first direction D1. A width of the word line WL or a gap between the word lines WL may be determined depending on the design rules. The word line WL may be first and second gate electrodes 132 and 232 of FIGS. 2 and 3.

A substrate (100 of FIGS. 2 and 3) may include a plurality of active regions AR. Each of the plurality of active regions AR may be defined by an element isolation film (110 of FIGS. 2 and 3). Each of the plurality of active regions AR may extend in a third direction D3. The third direction D3 may be a direction that is different from the first direction D1 and the second direction D2. For example, the third direction D3 may be a diagonal direction between the first direction D1 and the second direction D2.

With a decrease in the design rules of the semiconductor devices, each of the plurality of active regions AR may be disposed in a bar shape of a diagonal line or an oblique line. Further, the center of one active region AR among the plurality of active regions AR may be disposed to be adjacent to a distal end portion of the other active region AR.

Each of the plurality of bit lines BL may be disposed on the substrate 100. Each of the plurality of bit lines BL may extend in the second direction D2. Each of the plurality of bit lines BL may be spaced apart from each other in the first direction D1. Each of the plurality of bit lines BL may be disposed at equal gaps from each other. The width of the bit lines BL or the gap between the bit lines BL may be determined depending on the design rules.

The semiconductor device according to some example embodiments may include various contact arrangements disposed on the substrate 100. Various contact arrangements may include, for example, a direct contact DC, a buried contact BC, a landing pad LP, and the like.

The direct contact DC may mean a contact that electrically connects each of the plurality of active regions AR to the bit line BL. The buried contact BC may mean a contact that connects a plurality of active regions AR to a lower electrode (191 of FIGS. 2 and 3) of the capacitor.

In view of the arrangement structure, the contact area of each of the buried contact BC and the plurality of active regions AR may be small. Therefore, the conductive landing pad LP may be disposed to expand the contact area with each of the plurality of active regions AR and expand the contact area with the lower electrode 191 of the capacitor.

The landing pad LP may be disposed between each of the plurality of active regions AR and the buried contact BC, or may be disposed between the buried contact BC and the lower electrode 191 of the capacitor. In the semiconductor device according to some example embodiments, the landing pad LP may be disposed between the buried contact BC and the lower electrode 191 of the capacitor. By expanding the contact area through the introduction of the landing pad LP, a contact resistance between each of the plurality of active regions AR and the lower electrode 191 of the capacitor may be reduced.

In the semiconductor device according to some example embodiments, the direct contact DC may be disposed in a central portion of each of the plurality of active regions AR. The buried contact BC may be disposed at both distal end portions of each of the plurality of active regions AR.

Since the buried contact BC is disposed at both distal end portions of each of the plurality of active regions AR, the landing pad LP may be disposed to partially overlap the buried contact BC to be adjacent to both distal ends of each of the plurality of active regions AR. Alternatively, the buried contact BC may be disposed to overlap a plurality of active regions AR between the adjacent word lines WL and the adjacent bit lines BL.

The word line WL may be formed as a structure buried inside the substrate 100. The word line WL may be disposed across each of the plurality of active regions AR between the direct contacts DC or the buried contacts BC.

The two word lines WL may be disposed to cross the single active region AR. Since each of the plurality of active regions AR is disposed in the form of a diagonal line, the word line WL may have an angle of less than 90 degrees with each of the plurality of active regions AR.

The direct contact DC and the buried contact BC may be disposed symmetrically. Therefore, the direct contact DC and the buried contact BC may be disposed on a straight line along the second direction D2 and the third direction D3. The landing pad LP may be disposed in a zigzag form in the second direction D2 in which the bit line BL extends.

Referring to FIGS. 1 to 3, the semiconductor device according to some example embodiments may include a substrate 100, a conductive pattern 105, an element isolation film 110, a base insulating film 120, a first gate structure 130, a second gate structure 230, a buried contact BC, a landing pad LP, a fence 170, an interlayer insulating film 180, a direct contact DC, a bit line 140, a spacer structure 150, and a capacitor structure 190.

The substrate 100 may be, for example, an SOI (Silicon on Insulator substrate). Specifically, the substrate 100 may include a lower semiconductor film 102, a buried insulating film 104, and an upper semiconductor film 106. The lower semiconductor film 102, the buried insulating film 104, and the upper semiconductor film 106 may be sequentially stacked.

The lower semiconductor film 102 and the upper semiconductor film 106 may have, but are not limited to, a structure in which a base substrate and an epitaxial layer are stacked. The lower semiconductor film 102 and the upper semiconductor film 106 may include a silicon substrate, a gallium arsenide substrate, a silicon germanium substrate, a ceramic substrate, a quartz substrate, a display glass substrate, and/or the like. Hereinafter, the lower semiconductor film 102 and the upper semiconductor film 106 will be described as a silicon substrate as an example.

In some example embodiments, the buried insulating film 104 may include a material having an etching selectivity with respect to silicon oxide. The buried insulating film 104 may include, for example, either a silicon oxide or a metal oxide.

The substrate 100 may include an element isolation trench 100*t*. A bottom side of the element isolation trench 100*t* may be disposed inside the lower semiconductor film 102. By the process of forming the element isolation trench 100*t*, the side walls of the element isolation trench 100*t* may have an inclination, but the present disclosure is not limited thereto.

The element isolation film 110 may be disposed inside the element isolation trench 100*t*. The element isolation trench 100*t* may be disposed inside the upper semiconductor film 106, the buried insulating film 104, and the lower semiconductor film 102. The bottom side of the element isolation film 110 may be disposed inside the lower semiconductor film 102. The element isolation film 110 may have an STI (shallow trench isolation) structure having excellent element isolation characteristics. The element isolation film 110 may define a plurality of active regions AR.

The element isolation film 110 may include, for example, but is not limited to, at least one of a silicon oxide, a silicon nitride, a silicon oxynitride, and a combination thereof. The element isolation film 110 may be a single layer made up of one kind of insulating material, or may be a multilayer made up of a combination of a plurality of kinds of insulating materials.

In some example embodiments, the central part of the active region AR may be electrically connected to the bit line BL by the direct contact DC, and both distal ends of the active region AR may be electrically connected to the capacitor structure 190 by capacitor contacts BC and LP.

The semiconductor device according to some example embodiments may be a semiconductor device including a buried channel transistor (BCAT). The buried channel transistor may refer to a structure in which the gate electrodes 132 and 232 are buried inside the substrate 100. The upper sides of the gate electrodes 132 and 232 may be disposed below the upper side of the substrate 100.

Specifically, the substrate 100 may include a first gate trench 130*t* and a second gate trench 230*t*. The first gate trench 130*t* may be disposed inside the element isolation film 110. In some example embodiments, the bottom side of the first gate trench 130*t* may be disposed inside the buried insulating film 104. Alternatively, in some example embodiments, the bottom side of the first gate trench 130*t* may be disposed inside the lower semiconductor film 102.

The second gate trench 230*t* may be disposed inside the active region AR. In some example embodiments, the bottom side of the second gate trench 230*t* may be disposed inside the upper semiconductor film 106. The bottom side of the second gate trench 230*t* may be disposed above the bottom side of the first gate trench 130*t*.

The first gate structure 130 may be disposed inside the first gate trench 130*t*. That is, the first gate structure 130 may be buried inside the element isolation film 110. In some example embodiments, the first gate structure 130 may include a first gate insulating film 131, a first gate electrode 132, and a first gate capping film 134.

The first gate insulating film 131 may extend along the profile of the first gate trench 130*t*. The first gate electrode 132 is disposed on the first gate insulating film 131, and may fill a part of the first gate trench 130*t*. The first gate electrode 132 may be, for example, the word line WL of FIG. 1. The first gate capping film 134 may be disposed on the first gate electrode 132. The first gate capping film 134 may fill the first gate trench 130*t*.

In some example embodiments, the first gate structure 130 may further include a first insertion conductive film 133. The first insertion conductive film 133 may be disposed between the first gate electrode 132 and the first gate capping film 134.

The second gate structure 230 may be disposed inside the second gate trench 230*t*. That is, the second gate structure 230 may be buried inside the substrate 100. In some example embodiments, the second gate structure 230 may include a second gate insulating film 231, a second gate electrode 232, and a second gate capping film 234.

The second gate insulating film 231 may extend along the profile of the second gate trench 230*t*. The second gate electrode 232 is disposed on the second gate insulating film 231 and may fill a part of the second gate trench 230*t*. The upper side of the second gate electrode 232 is disposed above the upper side of the first gate electrode 132. The second gate electrode 232 may be, for example, the word line WL of FIG. 1. The second gate capping film 234 may be disposed on the second gate electrode 232. The second gate capping film 234 may fill the second gate trench 230*t*.

In some example embodiments, the second gate structure 230 may further include a second insertion conductive film 233. The second insertion conductive film 233 may be disposed between the second gate electrode 232 and the second gate capping film 234.

Referring to FIGS. 1 and 3, the first gate trench 130*t* and the second gate trench 230*t* may be connected to each other. The first gate trench 130*t* and the second gate trench 230*t* may be arranged in a row along the first direction D1 to bury a single word line WL extending along the first direction D1. Since the word line WL alternately passes through the active region AR and the element isolation film 110, the first gate trench 130*t* and the second gate trench 230*t* may be alternately disposed along the first direction D1. The first gate insulating film 131, the first gate electrode 132, the first insertion conductive film 133, and the first gate capping film 134 are each connected to the second gate insulating film 231, the second gate electrode 232, the second insertion conductive film 233 and the second gate capping film 234 to form a single word line WL of FIG. 1.

The first and second gate insulating films 131 and 231 may each include a silicon oxide, a silicon nitride, a silicon oxynitride and/or a high dielectric constant material having a higher dielectric constant than the silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The first and second gate electrodes 132 and 232 may each include, for example, at least one of a metal material, a conductive metal nitride, and a combination thereof. In some example embodiments, the first and second gate electrodes 132 and 232 may include at least one of Ti, TiN, Ta, TaN, W, WN, TiSiN, WSiN or a combination thereof.

The first and second insertion conductive films 133 and 233 may include materials different from those of the first and second gate electrodes 132 and 133. The first and second insertion conductive films 133 and 233 may each include, for example, doped polysilicon.

The first and second gate capping patterns 134 and 234 may include, for example, polysilicon, silicon nitride (SiN), silicon oxynitride (SiON), silicon oxide (SiO$_2$), silicon carbonitride (SiCN), silicon oxycarbonitride (SiOCN), and combinations thereof.

First and second source and drain regions 107*a* and 107*b* may each be disposed on both sides of the first gate trench 130*t* and the second gate trench 230*t*. The first and second source and drain regions 107*a* and 107*b* may be formed inside the upper semiconductor film 106. The first and second source and drain regions 107*a* and 107*b* may be a part of the active region AR disposed between the gate structures 130 and 230 adjacent to each other.

For example, the first source and drain region 107*a* may be formed at the center of the active region AR of the upper semiconductor film 106, and the second source and drain region 107*b* may be formed at both distal ends of the active region AR of the upper semiconductor film 106. In some example embodiments, although the two second gate structures 230 may share the single first source and drain region 107*a*, the embodiment is not limited thereto.

In some example embodiments, the conductive pattern 105 may be disposed between the element isolation film 110 and the substrate 100. The conductive pattern 105 may extend along the element isolation film 110 between the element isolation film 110 and the substrate 100. The conductive pattern 105 may surround the element isolation film 110 inside the substrate 100. The conductive pattern 105 may extend along the profile of the element isolation trench 100t, and the element isolation film 110 may be disposed on the conductive pattern 105 to fill the element isolation trench 100t.

The conductive pattern 105 may come into contact with the substrate 100. The conductive pattern 105 may come into contact with the lower semiconductor film 102, the buried insulating film 104, and the upper semiconductor film 106.

The conductive pattern 105 may include a conductive material. Accordingly, the conductive pattern 105 may electrically connect the second source and drain region 107b included in the active region AR of the upper semiconductor film 106 with the lower semiconductor film 102. The conductive pattern 105 may include, but is not limited to, for example, polysilicon, metal, and the like.

The base insulating film 120 may be disposed on the substrate 100. In some example embodiments, the base insulating film 120 may extend along the upper sides of the upper semiconductor film 106 and the element isolation film 110 in a region in which the direct contact DC and the buried contact BC are not formed.

The base insulating film 120 may be a single film. Unlike this, the base insulating film 120 may be multiple films. The base insulating film 120 may include, for example, at least one of silicon oxide and silicon nitride.

The bit line 140 may be disposed on the substrate 100. The bit line 140 may be disposed on the upper semiconductor film 106, the element isolation film 110, and the base insulating film 120. In some example embodiments, the bit line 140 may sequentially include conductive lines 141 and 142 and a bit line capping film 143 on the substrate 100. The bit line 140 may correspond to the bit line BL of FIG. 1.

In some example embodiments, the bit line 140 may include a plurality of conductive lines 141 and 142. For example, the bit line 140 may include a first conductive line 141 and a second conductive line 142 that are stacked sequentially.

Each of the first and second conductive lines 141 and 142 may include, but are not limited to, for example, at least one of polysilicon, TiN, TiSiN, tungsten, tungsten silicide and combinations thereof. For example, although the first conductive line 141 may include TiSiN, and the second conductive line 142 may include tungsten, the technical idea of the present disclosure is not limited thereto. In contrast, the bit line 140 may be a single conductive line or may include three or more conductive lines.

The bit line capping film 143 may be disposed on the second conductive line 142. The bit line capping film 143 may include, but is not limited to, for example, silicon nitride.

The spacer structure 150 may be disposed on the side face of the bit line 140. The spacer structure 150 may extend along the side face of the bit line 140. For example, the spacer structure 150 may extend in the second direction D2.

In some example embodiments, the spacer structure 150 may include a plurality of spacers 151 and 152. For example, the spacer structure 150 may include a first spacer 151 and a second spacer 152.

The first spacer 151 may extend along the side face of the bit line 140 and the side face of the direct contact DC. The first spacer 151 may extend along the side face of the bit line 140 and the upper side of the base insulating film 120 in the region in which the direct contact DC is not formed. The second spacer 152 may be disposed on the first spacer 151.

The first and second spacers 151 and 152 may each include, for example, but are not limited to, one of a silicon oxide film, a silicon nitride film, a silicon oxynitride film (SiON), a silicon oxycarbonitride film (SiOCN), air and a combination thereof. Unlike this, the spacer structure 150 may be a single spacer or may include three or more spacers.

The direct contact DC may be formed on the substrate 100 and the element isolation film 110. The direct contact DC may penetrate the base insulating film 120 and come into contact with the substrate 100.

In some example embodiments, although the direct contact DC may overlap the second gate insulating film 231 and/or the second gate capping film 234, the present disclosure is not limited thereto.

The direct contact DC may include a conductive material. Accordingly, the direct contact DC may electrically connect the bit line BL and the first source and drain region 107a. The direct contact DC may include, for example, but is not limited to, polysilicon.

The capacitor contacts BC and LP may be disposed on the substrate 100. The capacitor contacts BC and LP may connect the active region AR of the substrate 100 and the capacitor structure 190. In some example embodiments, the capacitor contacts BC and LP may include a buried contact BC and a landing pad LP.

The buried contact BC may be formed on the substrate 100. The buried contact BC may penetrate the base insulating film 120 and come into contact with the substrate 100. The buried contact BC may include a conductive material. Therefore, the buried contact BC may electrically connect the second source and drain region 107b and the landing pad LP. The buried contact BC may include, but is not limited to, for example polysilicon. In addition, the buried contact BC may include metal, metal silicide, metal nitride or combinations thereof.

The landing pad LP may be disposed on the buried contact BC. The landing pad LP may be disposed to overlap the buried contact BC. The landing pad LP may overlap the buried contact BC, for example, in a fourth direction D4.

The landing pad LP may include a conductive material. Accordingly, the landing pad LP may be electrically connected to the buried contact BC. The landing pad LP may include, for example, but is not limited to, tungsten (W).

The fence 170 may be disposed on the substrate 100. The fence 170 may overlap the first and second gate structures 130 and 230. The fence 170 may overlap the first and second gate structures 130 and 230, for example, in the fourth direction D4.

The fence 170 may include, for example, but is not limited to, at least one of silicon oxide, silicon nitride, silicon oxynitride, and combinations thereof. The fence 170 may separate the buried contact BC.

The interlayer insulating film 180 may be disposed on a part of the upper side of the landing pad LP and on the fence 170. The interlayer insulating film 180 may define a landing pad LP that forms a plurality of isolated regions. The interlayer insulating film 180 may expose a part of the upper side of the landing pad LP.

The interlayer insulating film 180 may include an insulating material. Accordingly, the landing pads LP may be electrically separated from each other. The interlayer insulating film 180 may include, for example, but is not limited to, at least one silicon oxide, silicon nitride, silicon oxynitride, and a lower dielectric constant (low-k) material having a dielectric constant smaller than silicon oxide.

The capacitor structure 190 may be disposed on the interlayer insulating film 180 and the capacitor contacts BC and LP. The capacitor structure 190 may be connected to the upper sides of the capacitor contacts BC and LP. For example, the interlayer insulating film 180 may be patterned to expose at least a part of the upper side of the landing pad LP.

The capacitor structure 190 may be connected to a part of the upper side of the landing pad LP exposed by the interlayer insulating film 180. Therefore, the capacitor structure 190 may be electrically connected to both end portions of the active region AR through the capacitor contacts BC and LP. The capacitor structure 190 is controlled by the first and second conductive lines 141 and 142 and the first and second gate electrodes 132 and 232, and may store data. In some example embodiments, the plurality of capacitor structures 190 may be disposed in a honeycomb pattern, with a capacitor structure 190 at each vertex of a hexagon and the center of the hexagon.

The capacitor structure 190 may include a lower electrode 191, a capacitor dielectric film 192, and an upper electrode 193. The capacitor structure 190 may store an electric charge inside the capacitor dielectric film 192, using a potential difference generated between the lower electrode 191 and the upper electrode 193.

The lower electrode 191 may be connected to the capacitor contacts BC and LP. For example, the lower electrode 191 may be connected to a part of the upper side of the landing pad LP exposed by the interlayer insulating film 180. Although the lower electrode 191 is only shown to be in a pillar form extending from the upper side of the landing pad LP in the fourth direction D4, this is merely an example. In another example, the lower electrode 191 may be in the form of a cylinder extending from the upper side of the landing pad LP in the fourth direction D4.

The capacitor dielectric film 192 may be formed on the lower electrode 191. In some example embodiments, the capacitor dielectric film 192 may extend along profiles of the side face and upper side of the lower electrode 191 and the profile of the upper side of the interlayer insulating film 180.

The upper electrode 193 may be formed on the capacitor dielectric film 192. Although the upper electrode 193 is only shown to fill the region between adjacent capacitor structures 190, this is merely an example. In another example, the upper electrode 193 may extend along the profile of the capacitor dielectric film 192.

As semiconductor devices become highly integrated, leakage currents may occur in various portions of the semiconductor device. For example, a junction leakage induced by the gate may occur under the buried channel array transistor.

However, in the semiconductor device according to some example embodiments, since the second gate electrode 232 that forms the access gate is formed on the buried insulating film 104, the junction leakage induced under the second gate electrode 232 can be improved and/or reduced.

Furthermore, if the source and drain region and the gate are located to be adjacent to each other, a strong electric field may be generated between them. This may cause direct tunneling between the source and drain region and the gate, and gate-induced drain leakage (GIDL) may occur accordingly. As semiconductor devices become highly integrated, such gate-induced drain leakage may occur not only at access gates but also at pass gates.

However, in the semiconductor device according to some example embodiments, the upper side of the first gate electrode 132 may be disposed below the upper side of the second gate electrode 232. Accordingly, an overlapping area between the second source and drain region 107b and the second gate electrode 232 may be reduced, and the gate-induced drain leakage may be reduced or prevented. Further, the second gate electrode 232 is disposed in the element isolation film 110, and the gate-induced drain leakage generated at the pass gate can be improved and/or reduced.

Further, a floating body effect in which the channel region of the transistor is isolated from the substrate 100 may be generated on the buried insulating film 104. Due to the floating body effect, the body of the transistor does not have a constant voltage value, which makes it difficult to control the threshold voltage of the transistor. Such a floating body effect may be generated by accumulating electric charges on the substrate 100 on the buried insulating film 104.

However, in some example embodiments, the conductive pattern 105 may extend along the element isolation film 110 and come into contact with the upper semiconductor film 106 and the lower semiconductor film 102. The conductive pattern 105 may electrically connect the upper semiconductor film 106 and the lower semiconductor film 102 to discharge the electric charge accumulated in the upper semiconductor film 106 to the lower semiconductor film 102.

Figure 4:
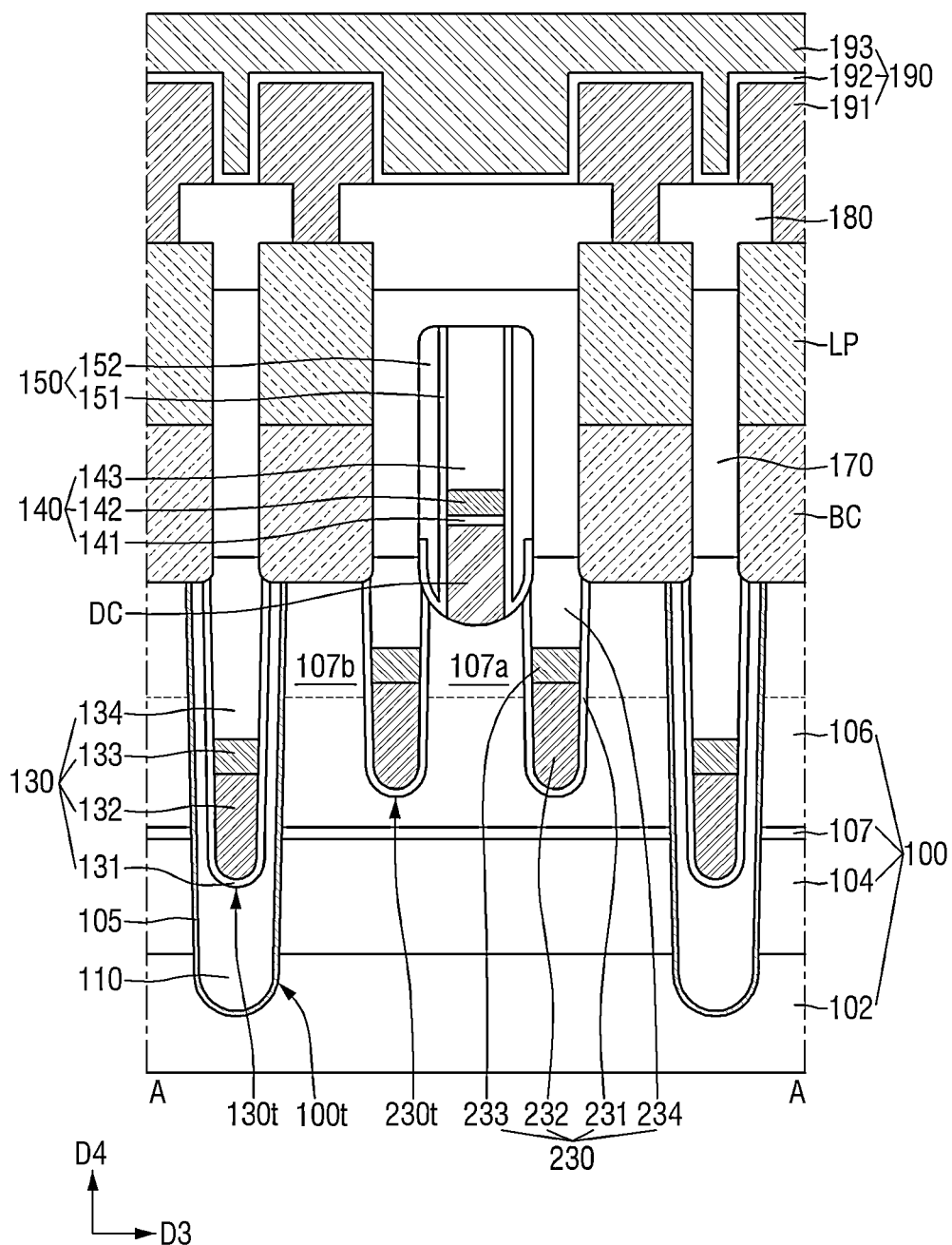
FIG. 4 is a diagram for explaining the semiconductor device according to some example embodiments.

FIG. 4 is a diagram for explaining a semiconductor device according to some example embodiments. FIG. 4 is a cross-sectional view taken along the line A-A of FIG. 1. For convenience of explanation, points different from those described using FIGS. 1 to 3 will be mainly described.

Referring to FIG. 4, in a semiconductor device according to some example embodiments, the substrate 100 may further include a first adhesive layer 107. The first adhesive layer 107 may be disposed between the upper semiconductor film 106 and the buried insulating film 104.

The first adhesive layer 107 may stick the upper semiconductor film 106 to the buried insulating film 104. Accordingly, the first adhesive layer 107 may be interposed between the upper semiconductor film 106 and the buried insulating film 104.

The first adhesive layer 107 may include an insulating material. The first adhesive layer 107 may include a material different from that of the buried insulating film 104. The first adhesive layer 107 may include, for example, but is not limited to, silicon oxide.

The element isolation film 110 may penetrate a part of the upper semiconductor film 106, the first adhesive layer 107, the buried insulating film 104, and the lower semiconductor film 102. The bottom side of the element isolation film 110 may be disposed inside the lower semiconductor film 102. The conductive pattern 105 may be disposed between the element isolation film 110, the upper semiconductor film 106, the first adhesive layer 107, the buried insulating film 104, and the lower semiconductor film 102.

The bottom side of the second gate structure 230 may be disposed above the upper side of the first adhesive layer 107. The bottom side of the second gate structure 230 may be disposed inside the upper semiconductor film 106. That is the second gate structure 230 may be separated from the first adhesive layer 107 by the upper semiconductor film 106.

Figure 5:
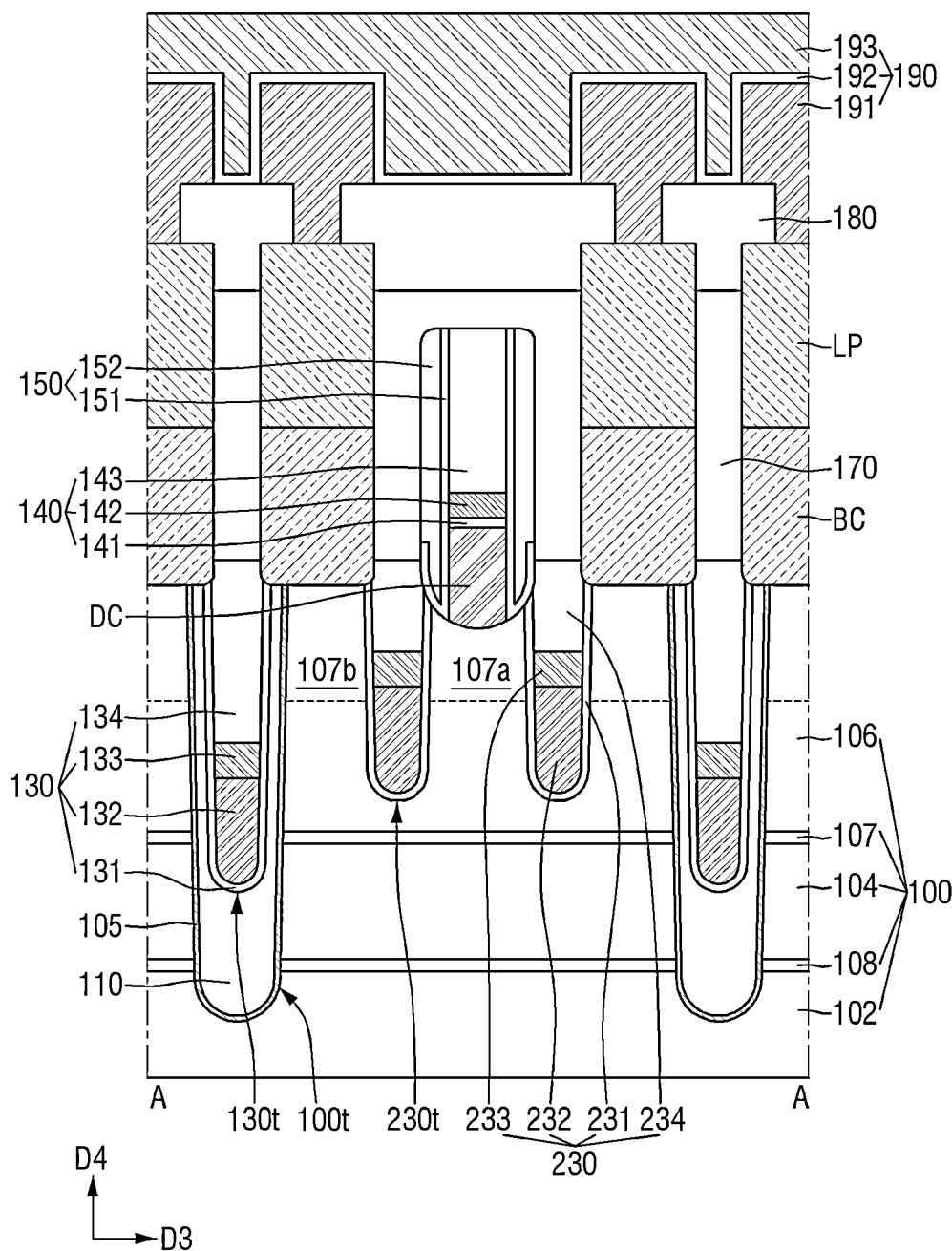
FIG. 5 is a diagram for explaining the semiconductor device according to some example embodiments.

FIG. 5 is a diagram for explaining a semiconductor device according to some example embodiments. FIG. 5 is a cross-sectional view taken along the line A-A of FIG. 1. For convenience of explanation, points different from those described using FIG. 4 will be mainly described.

Referring to FIG. 5, in a semiconductor device according to some example embodiments, the substrate 100 may further include a second adhesive layer 108. The second adhesive layer 108 may be disposed between the lower semiconductor film 102 and the buried insulating film 104.

The second adhesive layer 108 may stick the buried insulating film 104 to the lower semiconductor film 102. Accordingly, the second adhesive layer 108 may be interposed between the lower semiconductor film 102 and the buried insulating film 104.

The second adhesive layer 108 may include an insulating material. The second adhesive layer 108 may include a material different from that of the buried insulating film 104. The second adhesive layer 108 may include the same material as the first adhesive layer 107. The second adhesive layer 108 may include, for example, but is not limited to, silicon oxide.

The element isolation film 110 may penetrate a part of the upper semiconductor film 106, the first adhesive layer 107, the buried insulating film 104, the second adhesive layer 108, and the lower semiconductor film 102. The conductive pattern 105 may be disposed between the element isolation film 110, the upper semiconductor film 106, the first adhesive layer 107, the buried insulating film 104, the second adhesive layer 108, and the lower semiconductor film 102.

Figure 6:
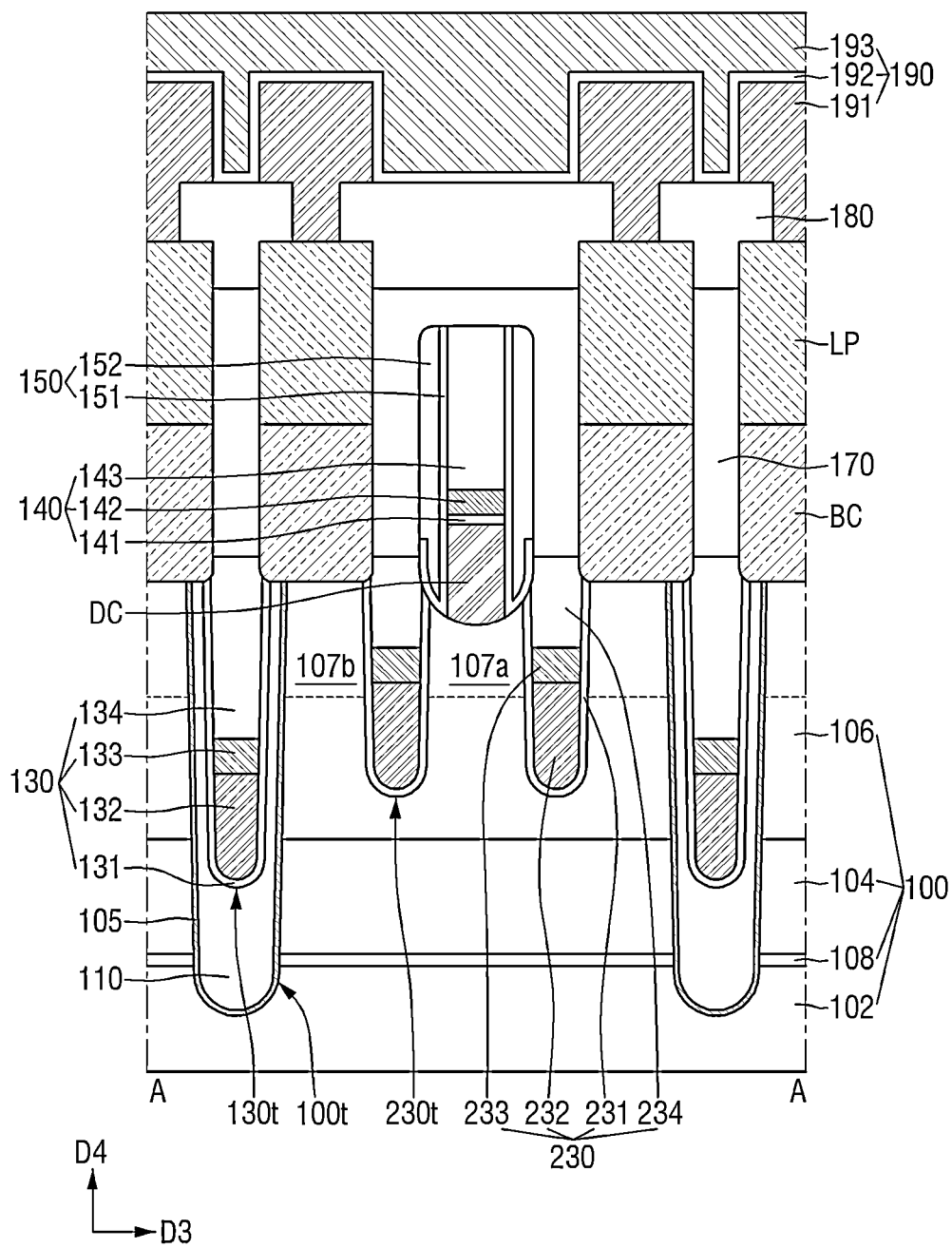
FIG. 6 is a diagram for explaining the semiconductor device according to some example embodiments.

FIG. 6 is a diagram for explaining a semiconductor device according to some example embodiments. FIG. 6 is a cross-sectional view taken along the line A-A of FIG. 1. For convenience of explanation, points different from those described using FIGS. 1 to 3 will be mainly described.

Referring to FIG. 6, in a semiconductor device according to some example embodiments, the substrate 100 may further include a second adhesive layer 108. The second adhesive layer 108 may be disposed between the lower semiconductor film 102 and the buried insulating film 104.

The second adhesive layer 108 may be the same as that described using FIG. 5.

Figure 7:
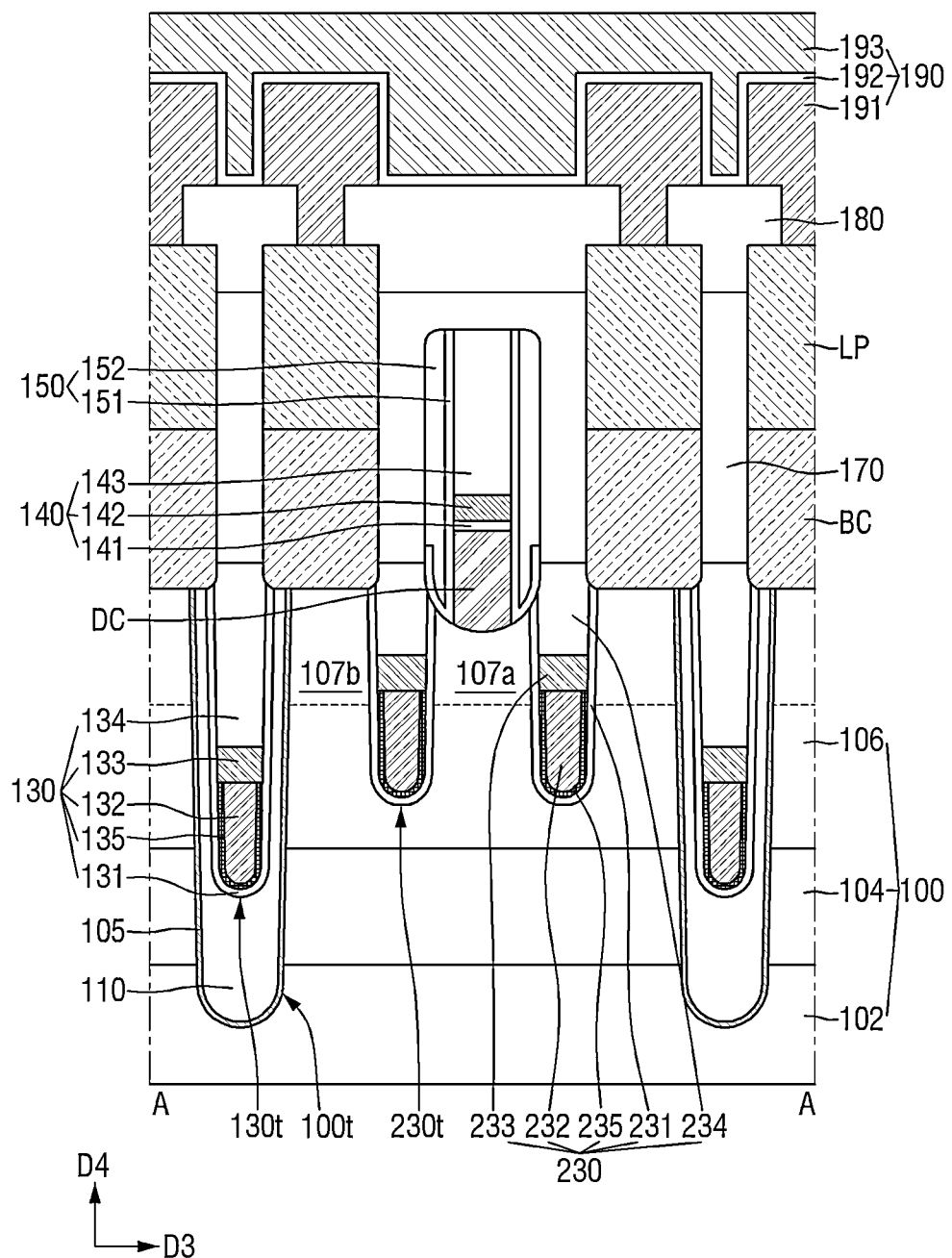
FIG. 7 is a diagram for explaining the semiconductor device according to some example embodiments.

FIG. 7 is a diagram for explaining a semiconductor device according to some example embodiments. FIG. 7 is a cross-sectional view taken along the line A-A of FIG. 1. For convenience of explanation, points different from those described using FIGS. 1 to 3 will be mainly described.

Referring to FIG. 7, in a semiconductor device according to some example embodiments, the first gate structure 130 may further include a first barrier film 135, and the second gate structure 230 may further include a second barrier film 235.

The first barrier film 135 may be disposed on the first gate insulating film 131. The first barrier film 135 may be disposed between the first gate insulating film 131 and the first gate electrode 132. The first barrier film 135 may extend along the first gate electrode 132. In some example embodiments, the first barrier film 135 may not be disposed between the first gate electrode 132 and the first insertion conductive film 133. The first barrier film 135 may not extend along the upper side of the first gate electrode 132.

The second barrier film 235 may be disposed on the second gate insulating film 231. The second barrier film 235 may be disposed between the second gate insulating film 231 and the second gate electrode 232. The second barrier film 235 may extend along the second gate electrode 232. In some example embodiments, the second barrier film 235 may not be disposed between the second gate electrode 232 and the second insertion conductive film 233. The second barrier film 235 may not extend along the upper side of the second gate electrode 232.

The first and second barrier films 135 and 235 may each include, for example, a metal nitride. For example, the first and second barrier films 135 and 235 may each include, but are not limited to, at least one of titanium nitride (TiN), tungsten nitride (WN), and combinations thereof.

In some example embodiments, the first and second barrier films 135 and 235 may include impurity-doped metal nitrides. For example, the metal nitrides of the first and second barrier films 135 and 235 may be doped with impurities that may change the work function.

Figure 8:
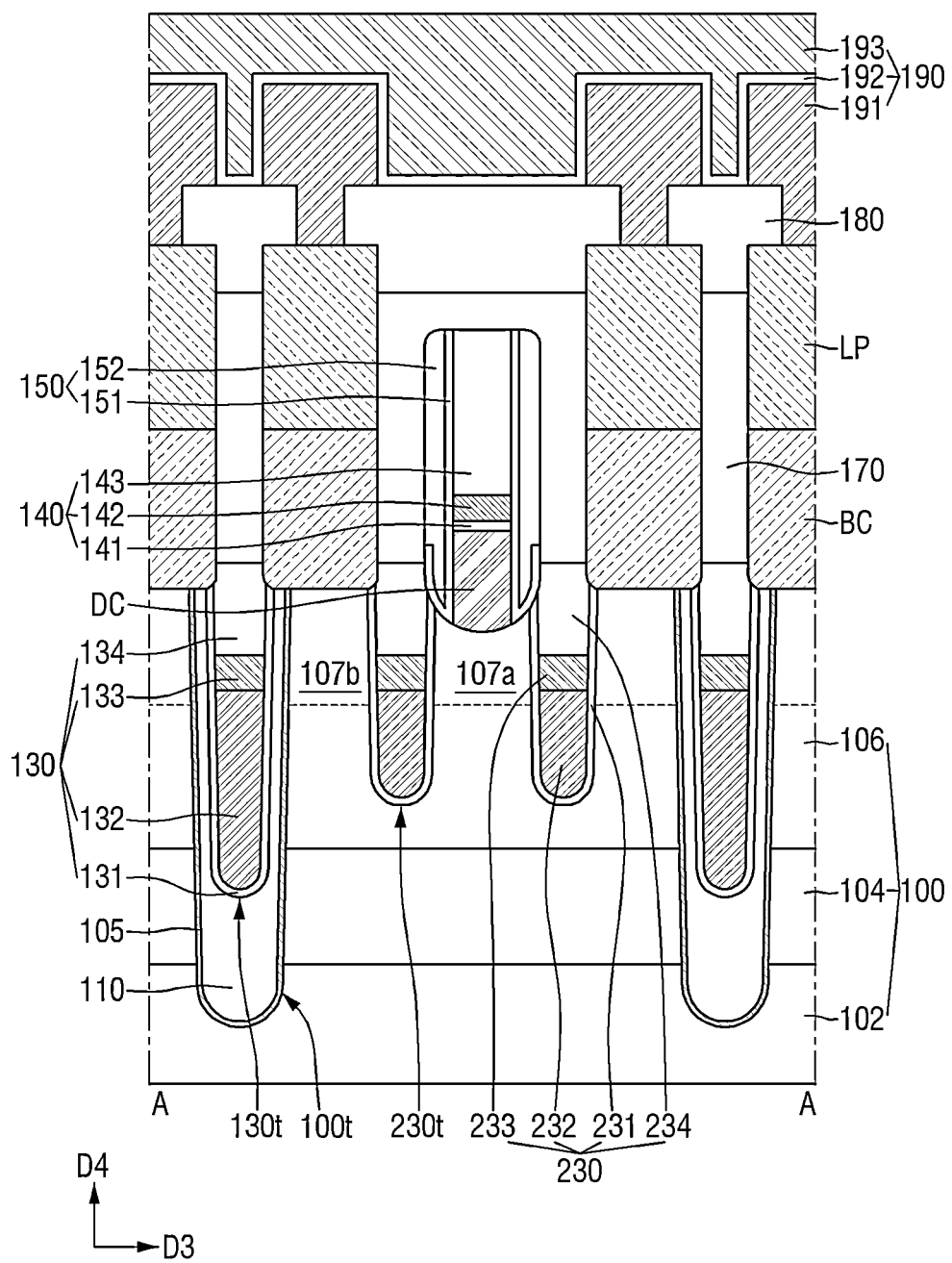
FIGS. 8 and 9 are diagrams for explaining the semiconductor device according to some example embodiments.
Figure 9:
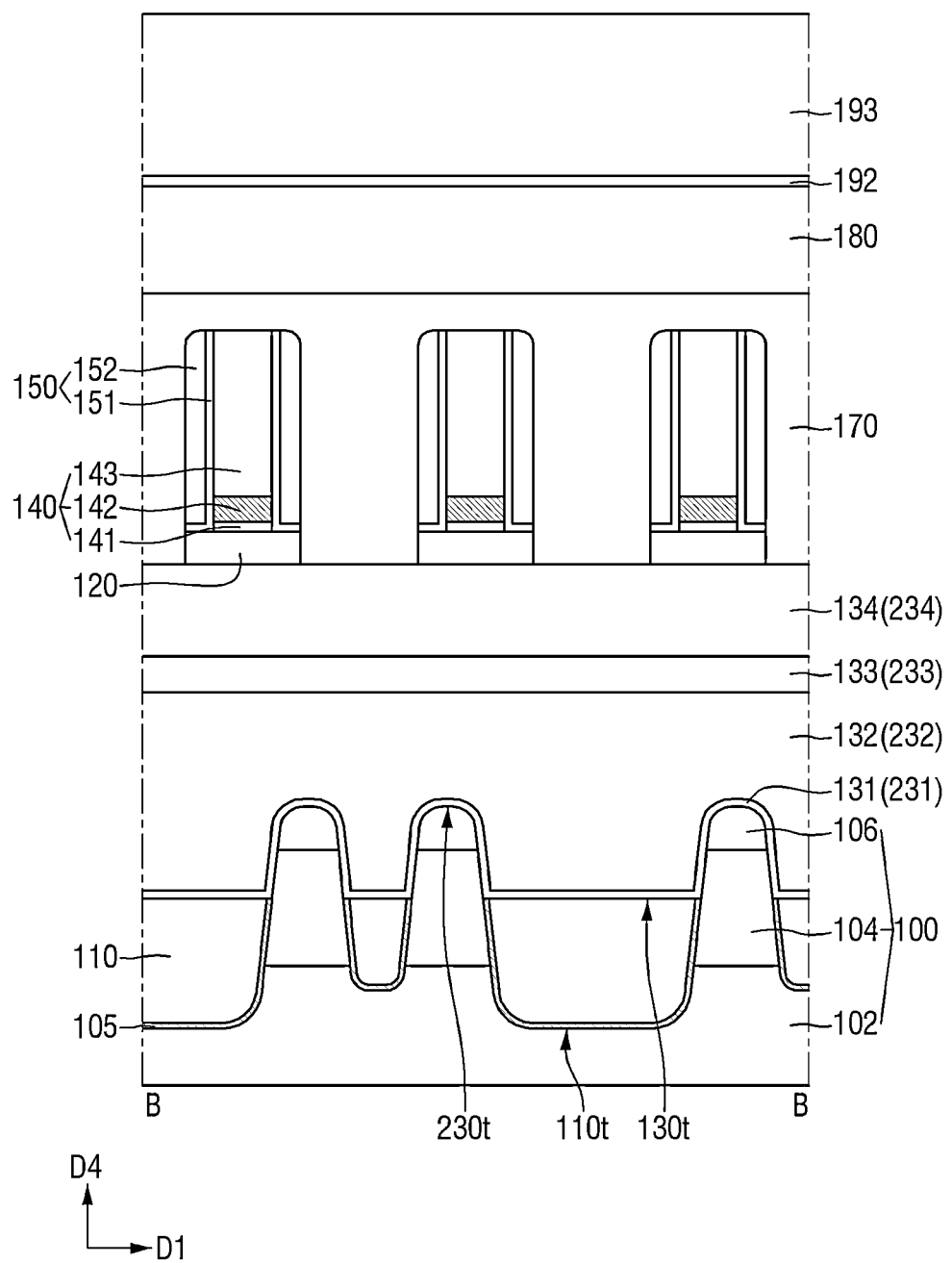

FIGS. 8 and 9 are diagrams for explaining the semiconductor device according to some example embodiments. FIG. 8 is a cross-sectional view taken along the line A-A of FIG. 1. FIG. 9 is a cross-sectional view taken along the line B-B of FIG. 1. For convenience of explanation, points different from those described using FIGS. 1 to 3 will be mainly described.

Referring to FIGS. 8 and 9, in a semiconductor device according to some example embodiments, the upper side of the first gate electrode 132 may be disposed on the same plane or substantially the same plane as the upper side of the second gate electrode 232.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIGS. 10 to 17 are intermediate stage diagrams for explaining a method for fabricating a semiconductor device according to some example embodiments.

Figure 10:
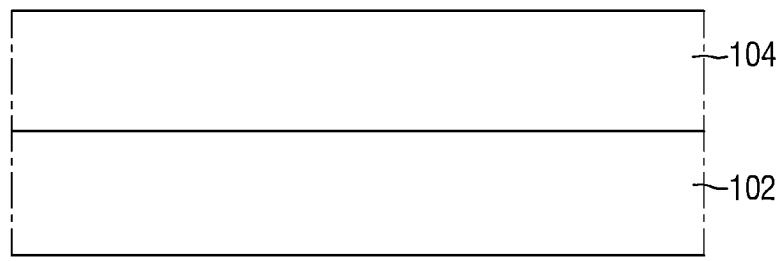
FIGS. 10 to 17 are intermediate process diagrams for explaining a method for fabricating a semiconductor device according to some example embodiments.
Figure 10:
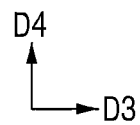

Referring to FIG. 10, the buried insulating film 104 may be formed on the lower semiconductor film 102. In some example embodiments, the buried insulating film 104 may grow on the lower semiconductor film 102.

Figure 11:
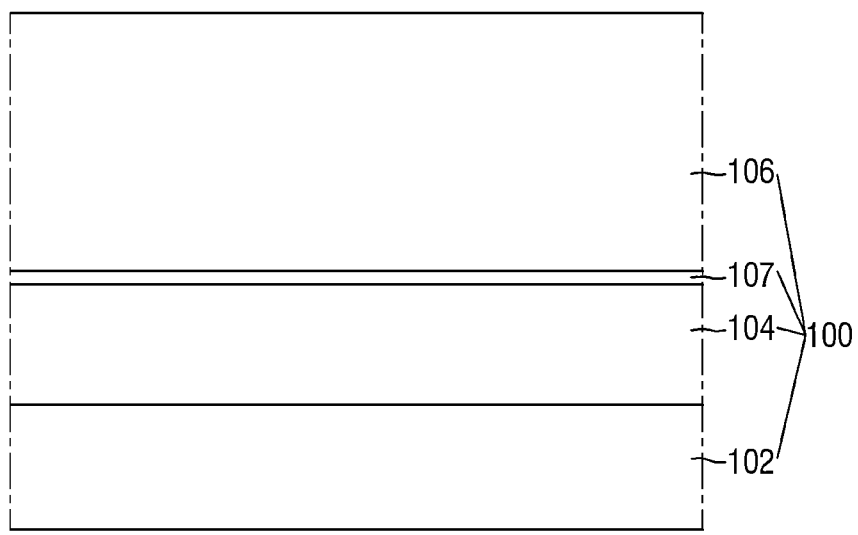
Figure 11:
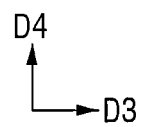

Referring to FIG. 11, the upper semiconductor film 106 may be stuck onto the buried insulating film 104 by the first adhesive layer 107. As a result, the substrate 100 including the lower semiconductor film 102, the buried insulating film 104, the first adhesive layer 107, and the upper semiconductor film 106 may be formed. A thickness of the first adhesive layer 107 may be much thinner than a thickness of the buried insulating film 104. In some example embodiments, the first adhesive layer 107 is not used.

Figure 12:
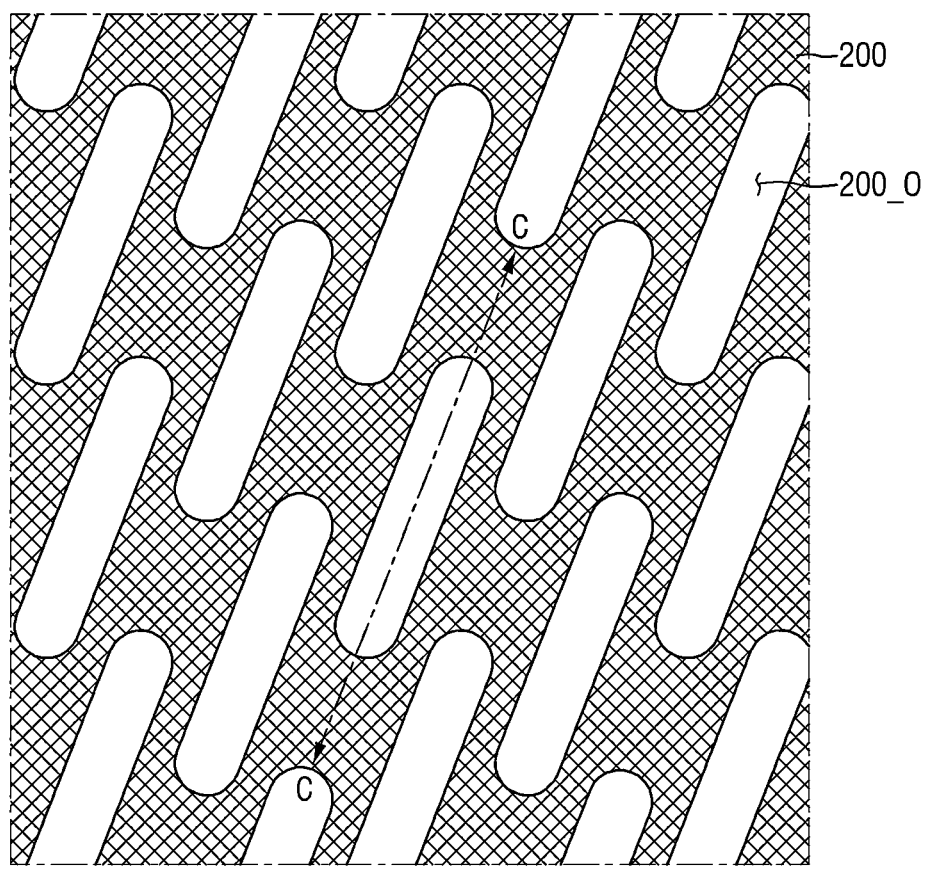
Figure 12:
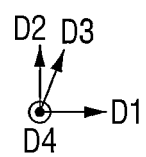
Figure 13:
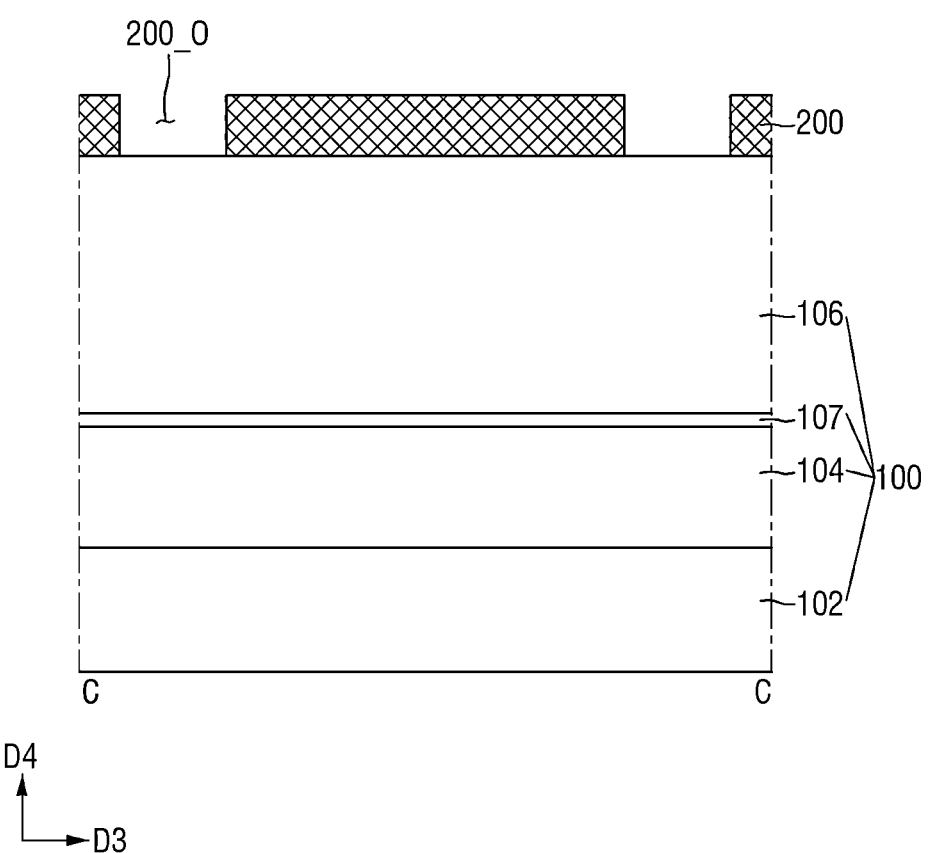
Figure 14:
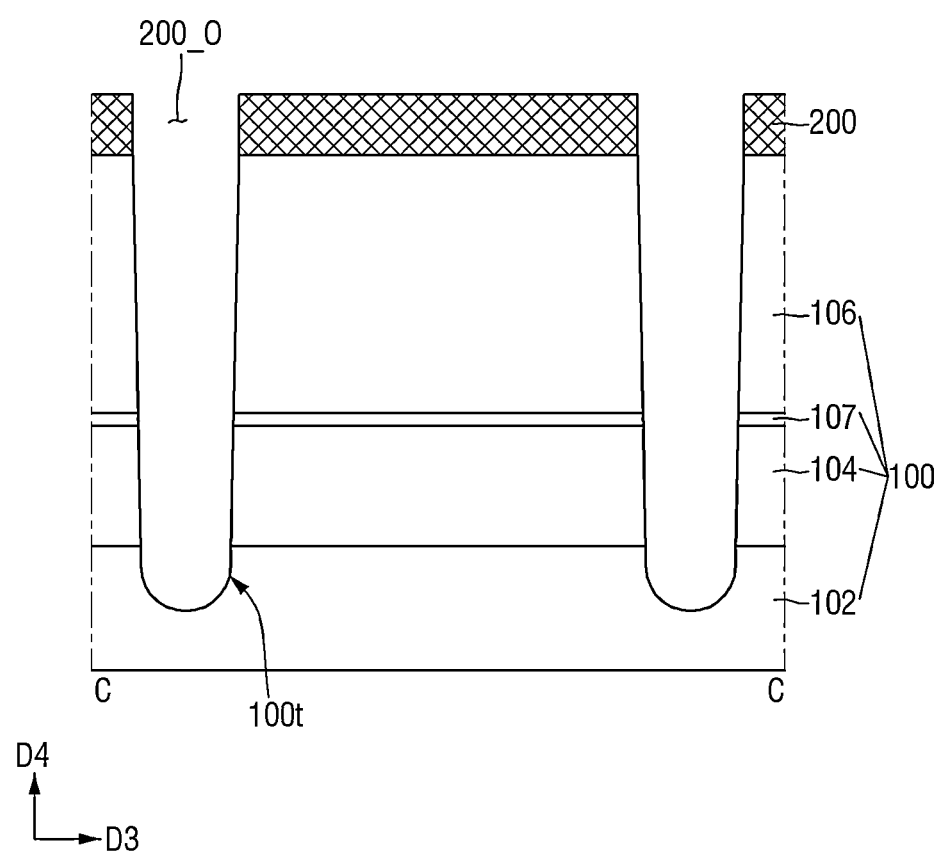
Figure 15:
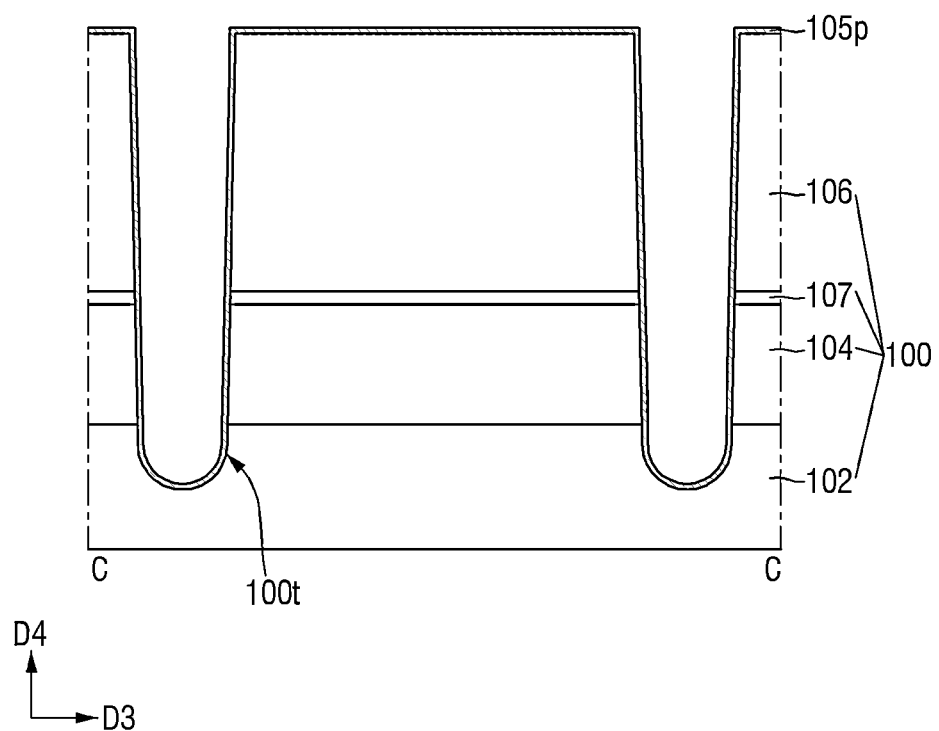

FIG. 12 is a layout diagram of the intermediate stage for explaining the method for fabricating the semiconductor device according to some example embodiments. FIGS. 13 to 15 are cross-sectional views taken along a line C-C of FIG. 12. The line C-C of FIG. 12 may correspond to the line A-A of FIG. 1.

Referring to FIGS. 12 and 13, a mask pattern 200 may be formed on the substrate 100. The mask pattern 200 may be formed on the upper semiconductor film 106.

The mask pattern 200 may include an opening 200_O. The opening 200_O may expose at least a part of the upper side of the upper semiconductor film 106.

Referring to FIG. 14, an element isolation trench 100t may be formed, using the mask pattern 200. The element isolation trench 100t may be formed inside the upper semiconductor film 106, the first adhesive layer 107, the buried insulating film 104, and the lower semiconductor film 102. The element isolation trench 100t may penetrate a part of the upper semiconductor film 106, the first adhesive layer 107, the buried insulating film 104, and the lower semiconductor film 102. The bottom side of the element isolation trench 100t may be disposed inside the lower semiconductor film 102.

The buried insulating film 104 may include a material different from that of the mask pattern 200. The buried insulating film 104 may include a material having an etching selectivity with respect to the mask pattern 200. Therefore, the buried insulating film 104 may be etched by an etching process that uses the mask pattern 200, and the element isolation trench 100t may be formed.

The first adhesive layer 107 may have a thickness at a level that is etched by an etching process that uses the mask pattern 200.

The mask pattern 200 may include, for example, silicon oxide. When the buried insulating film 104 includes the same material as the mask pattern 200, that is, when the buried insulating film 104 includes silicon oxide, the element isolation trench 100t penetrating the buried insulating film 104 may not be formed by an etching process that uses the mask pattern 200. As a result, the active region may not be defined by the element isolation film 110 formed inside the element isolation trench 100t later.

However, in the semiconductor device according to some example embodiments, since the buried insulating film 104 includes a material having an etching selectivity with respect to the mask pattern 200, the element isolation groove 100t penetrating the buried insulating film 104 may be formed. Therefore, the bottom side of the element isolation trench 100t may be disposed inside the lower semiconductor film 102, and the element isolation film 110 may be formed in the element isolation trench 100t later to define the active region.

Referring to FIG. 15, the mask pattern 200 may be removed.

Subsequently, a pre-conductive pattern 105p may be formed. The pre-conductive pattern 105p may extend along the upper side of the upper semiconductor film 106 and the bottom side and side walls of the element isolation trench 100t.

Figure 16:
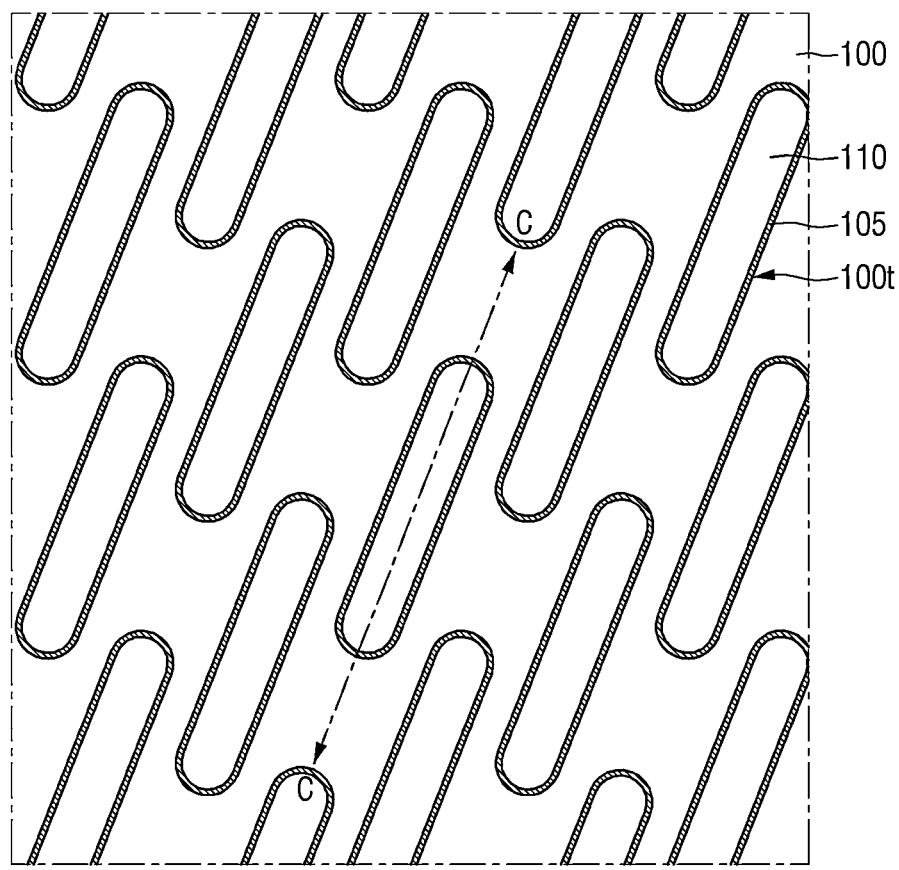
Figure 16:
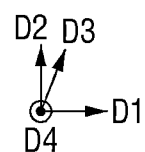
Figure 17:
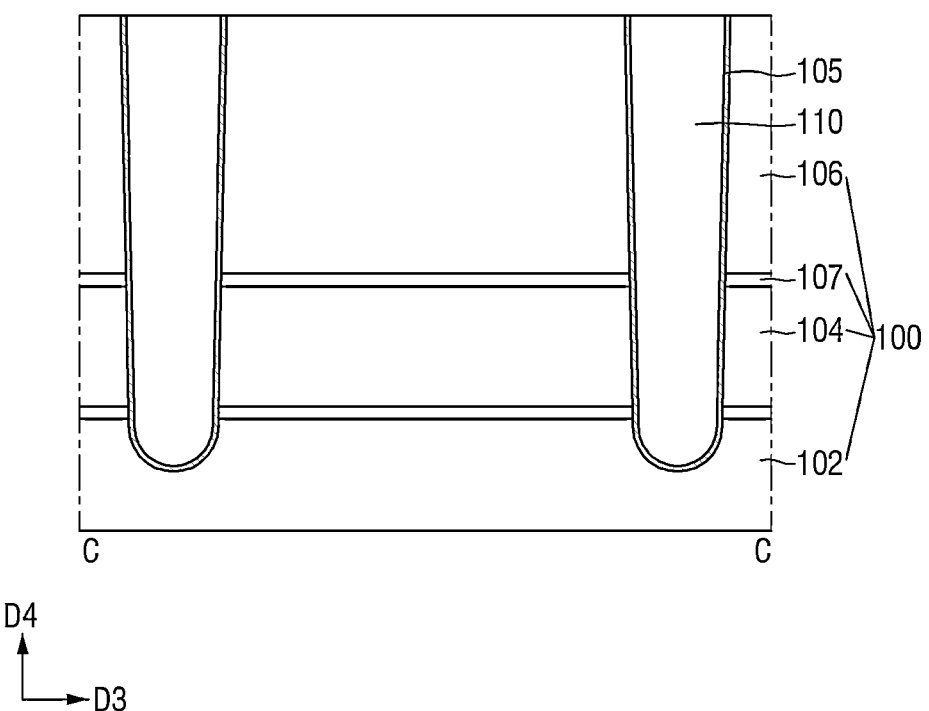

FIGS. 16 and 17 are layout diagrams of the intermediate stage for explaining the method for fabricating the semiconductor device according to some example embodiments. FIG. 17 is a cross-sectional view taken along a line C-C of FIG. 16.

Referring to FIGS. 16 and 17, the element isolation film 110 that fills the element isolation trench 100t may be formed on the conductive pattern 105.

For example, a pre-element isolation film (not shown) which fills the element isolation trench 100t and covers the upper semiconductor film 106 may be formed on the pre-conductive pattern 105p. Subsequently, the pre-conductive pattern 105p and the pre-element isolation film formed on the upper semiconductor film 106 may be removed. Accordingly, the conductive pattern 105 and the element isolation film 110 may be formed inside the element isolation trench 100t.

Next, referring to FIG. 4, the first gate structure 130 and the second gate structure 230 may be formed. After that, the direct contact DC, the bit line 140, the spacer structure 150, the buried contact BC, the landing pad LP, the interlayer insulating film 180, and the capacitor structure 190 may be formed.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A semiconductor device comprising:
a substrate including a lower semiconductor film, a buried insulating film, and an upper semiconductor film which are sequentially stacked, the buried insulating film includes either silicon nitride or metal oxide;
an element isolation film defining an active region inside the substrate;
a conductive pattern between the element isolation film and the substrate and being in contact with the lower semiconductor film, the buried insulating film, and the upper semiconductor film;
a first gate trench inside the upper semiconductor film;
a first gate insulating film extending conformally along the first gate trench;
a first gate electrode filling a part of the first gate trench on the first gate insulating film;
a second gate trench inside the element isolation film;
a second gate insulating film extending conformally along the second gate trench; and
a second gate electrode filling a part of the second gate trench on the second gate insulating film,
a bottommost side of the element isolation film being inside the lower semiconductor film, and
a bottommost side of the second gate trench being below an entirety of the upper semiconductor film and at a vertical level lower than a bottommost side of the first gate trench and being at a vertical level higher than the bottommost side of the element isolation film.

2. The semiconductor device of claim 1, wherein the conductive pattern extends along the element isolation film.

3. The semiconductor device of claim 1, further comprising:
a first adhesive layer between the buried insulating film and the upper semiconductor film.

4. The semiconductor device of claim 3, further comprising:
a second adhesive layer between the lower semiconductor film and the buried insulating film.

5. The semiconductor device of claim 3, wherein the buried insulating film includes a material different from the first adhesive layer.

6. The semiconductor device of claim 5, wherein the first adhesive layer includes the same material as a second adhesive layer.

7. The semiconductor device of claim 1, further comprising:
a second adhesive layer between the lower semiconductor film and the buried insulating film.

8. The semiconductor device of claim 1, wherein a bottom side of the first gate trench is inside the upper semiconductor film.

9. The semiconductor device of claim 1, wherein a bottommost side of the second gate electrode is in contact with the second gate insulating film and is inside the buried insulating film.

10. The semiconductor device of claim 1, wherein a bottommost side of the second gate trench is inside the buried insulating film.

11. A semiconductor device comprising:
a substrate including a lower semiconductor film, a buried insulating film, and an upper semiconductor film which are sequentially stacked, the buried insulating film includes either silicon nitride or metal oxide;
an element isolation film defining an active region inside the substrate, and having a bottom side inside the lower semiconductor film;
a conductive pattern extending along the element isolation film between the element isolation film and the substrate, the conductive pattern is in contact with the lower semiconductor film, the buried insulating film, and the upper semiconductor film;
a first gate trench penetrating the upper semiconductor film and having a bottom side inside the upper semiconductor film;
a first gate insulating film extending conformally along the first gate trench;
a first gate electrode on the first gate insulating film and filling a part of the first gate trench;
a second gate trench inside the element isolation film;
a second gate insulating film extending conformally along the second gate trench; and
a second gate electrode on the second gate insulating film and filling a part of the second gate trench, and
a bottommost side of the second gate trench being below an entirety of the upper semiconductor film and at a vertical level lower than a bottommost side of the first gate trench and being at a vertical level higher than the bottommost side of the element isolation film.

12. The semiconductor device of claim 11, further comprising:
a first adhesive layer between the buried insulating film and the upper semiconductor film and including a material different from the buried insulating film.

13. The semiconductor device of claim 12, further comprising:
a second adhesive layer between the buried insulating film and the lower semiconductor film and including a material different from the buried insulating film.

14. The semiconductor device of claim 11, further comprising:
a second adhesive layer between the buried insulating film and the lower semiconductor film and including a material different from the buried insulating film.

15. The semiconductor device of claim 11, further comprising:
a source and drain region inside the active region, the active region being inside the upper semiconductor film, between the first gate trench and the second gate trench; and
a capacitor structure electrically connected to the source and drain region on the substrate.

16. The semiconductor device of claim 11, wherein
the active region extends in a first direction, and
the first gate electrode and the second gate electrode extend in a second direction different from the first direction, and are spaced apart from each other in a third direction intersecting the second direction.

17. The semiconductor device of claim 16, further comprising:
a bit line extending in a fourth direction intersecting the third direction on the substrate.

18. A method for fabricating a semiconductor device, the method comprising:
forming an element isolation trench which defines a plurality of active regions, using a mask pattern, on a substrate in which a lower semiconductor film, a buried insulating film, and an upper semiconductor film are sequentially stacked, the buried insulating film includes either silicon nitride or metal oxide;
forming a conductive pattern which extends conformally along the element isolation trench;
forming an element isolation film which fills the element isolation trench on the conductive pattern; and
forming a gate structure extending in a first direction inside the element isolation film and a respective one of the plurality of active regions,
a bottommost side of the element isolation trench is inside the lower semiconductor film,
the buried insulating film includes a material having an etching selectivity with respect to the mask pattern,
the conductive pattern is in contact with the lower semiconductor film, the buried insulating film, and the upper semiconductor film, and
a bottommost side of the gate structure inside the element isolation film being at a vertical level lower than a bottommost side of the gate structure inside the respective one of the plurality of active regions and being at a vertical level higher than the bottommost side of the element isolation film.

* * * * *